(12) United States Patent
Larsen

(10) Patent No.: US 6,580,760 B1
(45) Date of Patent: Jun. 17, 2003

(54) LINE DRIVE ARCHITECTURE WITH PROGRAMMABLE GAIN AND DRIVE

(75) Inventor: Frode Larsen, Tinton Falls, NJ (US)

(73) Assignee: GlobespanVirata, Inc., Red Bank, NJ (US)

( * ) Notice: Subject to any disclaimer, the term of this patent is extended or adjusted under 35 U.S.C. 154(b) by 0 days.

(21) Appl. No.: 09/384,671

(22) Filed: Aug. 27, 1999

Related U.S. Application Data

(60) Provisional application No. 60/098,324, filed on Aug. 28, 1998.

(51) Int. Cl.[7] ............................... H03F 3/45; H04B 3/00
(52) U.S. Cl. ..................... 375/257; 375/219; 330/252
(58) Field of Search .......................... 375/257, 219, 375/220, 221, 222; 330/252, 258, 69; 379/399.01, 399.02, 413.02

(56) References Cited

U.S. PATENT DOCUMENTS

| | | | | |
|---|---|---|---|---|
| 5,166,635 A | * | 11/1992 | Shih | 330/253 |
| 5,381,112 A | * | 1/1995 | Rybicki et al. | 330/253 |
| 5,825,819 A | * | 10/1998 | Cogburn | 330/255 |
| 5,877,654 A | * | 3/1999 | Fong et al. | 330/292 |
| 6,226,322 B1 | * | 5/2001 | Mukherjee | 333/28 R |

* cited by examiner

*Primary Examiner*—Stephen Chin
*Assistant Examiner*—David B. Lugo
(74) *Attorney, Agent, or Firm*—Thomas, Kayden, Horstemeyer & Risley

(57) ABSTRACT

In general, the line driver is defined by an input and output stage wherein the input stage is identified by the deriving of the open loop gain of a preamplifier and the output stage is defined by the deriving of the open loop gain of two drivers that provide power required for the line driver to drive a line. Both, the preamplifier and the drivers have inputs that sit at a common mode voltage, thereby inhibiting a common mode input voltage swing and limiting distortion in the line driver. The gain of the preamplifier may be changed to a desired value by regulating the values of resistors therein, thereby reducing distortion by maximizing the open loop gain for all lines and DSL applications. The line driver can be configured for any desired closed loop gain, regardless of whether the gain value is below or above 1. The drivers of the, output stage use a set of programmable output devices to allow for maximum drive capability of the drivers to be programmed under digital control. Digital programmability of the output drive allows the line driver to be reconfigured by digital control, so as to provide for the driving of the twisted pair, regardless of unexpected impedances, such as a bridge tap.

19 Claims, 4 Drawing Sheets

LINE DRIVE ARCHITECTURE WITH PROGRAMMABLE GAIN AND DRIVE

CROSS-REFERENCE TO RELATED APPLICATIONS

This application claims the benefit of U.S. Provisional Application Serial No. 60/098,324, filed on Aug. 28, 1998, and entitled "Line Driver Architecture with Programmable Gain and Drive," which is incorporated by reference herein in its entirety.

FIELD OF THE INVENTION

The present invention generally relates to broadband networks. More specifically, the invention is related to an inverting line driver architecture having reduced distortion and improved power efficiency.

BACKGROUND OF THE INVENTION

With the advancement of technology and the need for instantaneous information, the ability to transfer digital information from one location to another, such as from a central office (CO) to a customer premises (CP), has become more and more important. Allowing for increasing data transmission rates has become a requirement, as opposed to an option.

As part of the system responsible for proper transmission and reception of data in a broadband network, an analog front end (AFE) interfaces between an analog transmission medium, such as an analog telephone line, and digital signal processing circuits. The AFE, among other functions, converts a digital signal into a continuous time analog signal. Particular to the case of a digital subscribe line (DSL) AFE with an integrated line driver, the AFE also puts this converted signal on a two-wire pair. The AFE circuit performs this function by using the combination of a digital-to-analog converter and an analog-to-digital converter. The digital-to-analog converter receives digital signals from a digital signal processor (DSP), and converts them to analog signals, upon which the analog signals are transmitted to a line driver. The analog-to-digital converter receives analog signals, converts them to digital signals, and furnishes them to the DSP. The AFE may also incorporate other elaborate analog signal processing.

Once the analog signal is transmitted to the line driver, the line driver drives the analog signal through the two-wire pair in accordance with a required power particular to the application considered and the type of line driven. Most established DSL applications have a required standard power spectral density template that they are required to meet. As an example, for the most common DSL service currently deployed (2B1Q HDSL), the required transmit power is approximately 13.5 dBm. This yields a maximum peak power of 18.6 dBm, for a peak current of 48.2 mA (assuming 6 Vpp differential output voltage, 3 dB loss in back matching resistors, and a peak-to-average ratio (PAR) of 1.8 for 2B1Q).

At the other extreme, the required transmit power for a Discrete Multi Tone-Asymmetric Digital Subscriber Line-Central Office (DMT-ADSL-CO), assuming 3 dB loss in the back matching resistors and a PAR of 5.3 for DMT, is approximately 20.5 dBm. This yields a maximum peak power of 37.98 dBm, for a peak current of 2095 mA (assuming a 6 Vpp differential output voltage). It should be noted that there is a multitude of other applications at various power levels between these two extremes. Also, due to line impairment caused by a variety of different factors, particularly bridge taps, the actual line impedance might be significantly less then expected, and the load current can thus be significantly higher then expected.

For DSL systems, the line driver is typically the most significant source of distortion in the data transmit path, due to the high speed and large load current requirement, combined with the variety of line configurations encountered. For most high-speed ADSL applications the trend is currently to avoid transmitting and receiving in the same frequency bands. From the customer premise side, typically there is transmission at the low frequency end of the band and reception at the upper frequency end of the band. Thus, distortion products, which fall at multiples of the transmit-signal, fall in the receive spectrum. Typically, distortion in the transmit-path couples into the receive path through a hybrid, which makes the receiver implementation significantly more challenging. The receiver needs to recover the portion of the transmit-signal, which falls in the receive-band, as well as the receive-signal by itself. Therefore, limitation of distortion in the transmit-path is important to both the transmission and reception of information.

It should also be noted, that distortion introduced in the receive-band by any element in the transmit path, up to the line driver, can be filtered out with a passive external LC filter before it is fed to the line driver. However, if the line driver introduces the distortion, it is not practical to filter the distortion out due to the low impedance level. Thus, the distortion introduced by the line driver is the final limiting factor for the distortion of the transmit-path, which typically is the most critical factor in terms of achievable reach of the system.

Typical line driver implementation is based on high input impedance amplifiers. This makes it easy to interface to the line driver. However, it implies that there is significant signal swing across the input terminals of the line driver. This changes the common mode input to the line driver, which inherently changes the gain, in turn, yielding distortion and hampering transmitted and received data.

Since the conventional line driver architecture is non-inverting, it is impossible to introduce voltage attenuation in this stage of signal transmission. Thus, if voltage attenuation is desired, it must be performed at a previous stage in the signal chain. This will, however, reduce the signal to noise ratio of the overall signal path, since the noise will not be reduced when the signal is reduced. Most of the noise is introduced before the line driver, and the less voltage gain needed at this stage, the better the overall signal to noise ratio achieved. Further, for some ADSL applications, standards allow for power cutback for short loop operation. For DMT ADSL, the appropriate standards are ITU G.992.1 for G-Lite, and ITU G.992.2 and ANSI T1.413 for G-Heavy. Thus, the system would need to be able to attenuate the signal significantly below the standard magnitude. If this can be done at the final stage of the line driver, it can be achieved with no additional digital signal processing, and no cost in terms of signal to noise ratio. Further, if the attenuation had to be performed in the digital domain, by reducing the analog input signal going into the AFE, the signal to noise (SNR) ratio would drop proportional to the reduction of the signal level.

It should also be noted, that an amplifier, such as the high input amplifiers of the line driver, will have a higher closed loop bandwidth if it has a low gain. Thus, for optimum overall performance, maximum closed loop bandwidth, and as little closed loop gain as possible, is desired.

Also, current line drivers are typically barely capable of delivering the required power into an ideal load. As an example, if the line driver were designed for DMT ADSL customer premises applications operating at 7 Vpp output swing, the required peak current would be 300 mA in order to generate the required 13.5 dBm into a 100-Ohm line. In order to achieve a power efficient design, the design would be done assuming a maximum output current of about 350 mA. However, in the case of bridge taps, when the effective load is cut in half and the maximum required current therefore could be about 600 mA, significant distortion results. In order to address this problem, an increase in the drive capability of the line driver could be implemented. This would, however, reduce the speed of the device, given the same quiescent power, and increase the distortion during normal load conditions. Thus, the same amplifier cannot be optimized readily to handle both scenarios.

Therefore, the system designer typically has to weigh trade-offs between maximum line power, distortion, and quiescent current in order to find the line driver most suitable for a given application. If power consumption were most significant, the designer may pick a line driver that is barely capable of delivering the required power, but can do this efficiently with little distortion. However, if the device is connected to a line with a bridge tap, such that it is asked to deliver twice the nominal line current, significant distortion will be observed, and the line will come down. Alternatively, the designer could design the system to be able to handle bridge taps on all lines, but would then not be able to meet the power budget.

Bipolar drivers are also used to circumvent this problem. These cannot, however, be integrated readily into a single chip AFE, as it is impractical to perform the other functions of the AFE in pure bipolar technology. The bipolar devices also typically have significantly higher power consumption than their CMOS counterparts due to the higher supply voltage and inability of bipolar devices to go close to either supply. Most CMOS line drivers typically can go within less then 1V from either power supply. Bipolar drivers, however, typically rely on Darlington output stages, which makes it impossible to get closer than about 2V from either supply rail.

Therefore, there is a need in the industry for an amplifier architecture which is specifically suited for large drive, high speed applications, and which can achieve an optimized output stage for any load condition without causing distortion or utilizing excessive amounts of power.

SUMMARY OF THE INVENTION

Briefly described, the invention is a line driver implemented within an analog front end, which utilizes an inverting amplifier architecture with programmable open loop gain, programmable closed loop gain and attenuation, programmable maximum output drive, and which eliminates distortion otherwise introduced by gain variation caused by common mode input variations.

In general, a first embodiment of the invention provides for a line driver having an input stage and an output stage. The input stage of the line driver is identified by the deriving of the open loop gain of a preamplifier. The output stage is defined by the deriving of the open loop gain of two drivers that provide the power required for the line driver to drive a two-wire pair. Both, the preamplifier of the input stage, and the drivers of the output stage, have inputs that sit at a common mode voltage, thereby inhibiting a common mode input voltage swing and limiting distortion in the line driver.

The closed loop gain of the line driver may be changed to a desired value by regulating the values of resistors therein, thereby providing for the obtaining of a desired gain, regardless of whether the gain value is below or above 1. The size of output devices in the drivers are programmable under digital control to achieve an optimum size for a given drive requirement for a given digital subscriber line application and line. Digital programmability of the output drive allows the line driver to be reconfigured by digital control, so as to provide for the driving of the two-wire pair, regardless of unexpected impedances, such as a bridge tap.

The invention has numerous advantages, a few of which are delineated hereafter as examples. Note that the embodiments of the invention, which are described herein, possess one or more, but not necessarily all, of the advantages, set out hereafter.

One advantage of the invention is that the input common-mode of the preamplifiers, as well as the output drivers, of the line driver is not a function of the input signal, but instead, is fixed at the independently controlled and applied common mode voltage, VCM.

Another advantage of the inverting amplifier architecture is that it enables the closed loop gain of the line driver to be less then one.

Another advantage of the invention is that it provides programmable open loop gain.

Another advantage of the line driver is that it provides for programmable drive capability, wherein the system adjusts the maximum possible output current of the output driver according to the application and two-wire pair conditions, to obtain the optimum maximum current.

Other objects, features, and advantages of the present invention will become apparent to one of reasonable skill in the art upon examination of the following drawings and detailed description. It is intended that all such additional objects, features, and advantages be included herein within the scope of the present invention, as defined by the claims.

BRIEF DESCRIPTION OF THE DRAWINGS

The present invention will be more fully understood from the detailed description given below, and from the accompanying drawings of the preferred embodiments of the invention, which however, should not be taken to limit the invention to the specific embodiment, but are for explanation and for better understanding. Furthermore, the drawings are not necessarily to scale, emphasis instead being placed upon clearly illustrating the principles of the invention. Finally, like-referenced numerals in the figures designate corresponding parts throughout the several drawings.

DESCRIPTION OF THE PREFERRED EMBODIMENT

Figure 1:
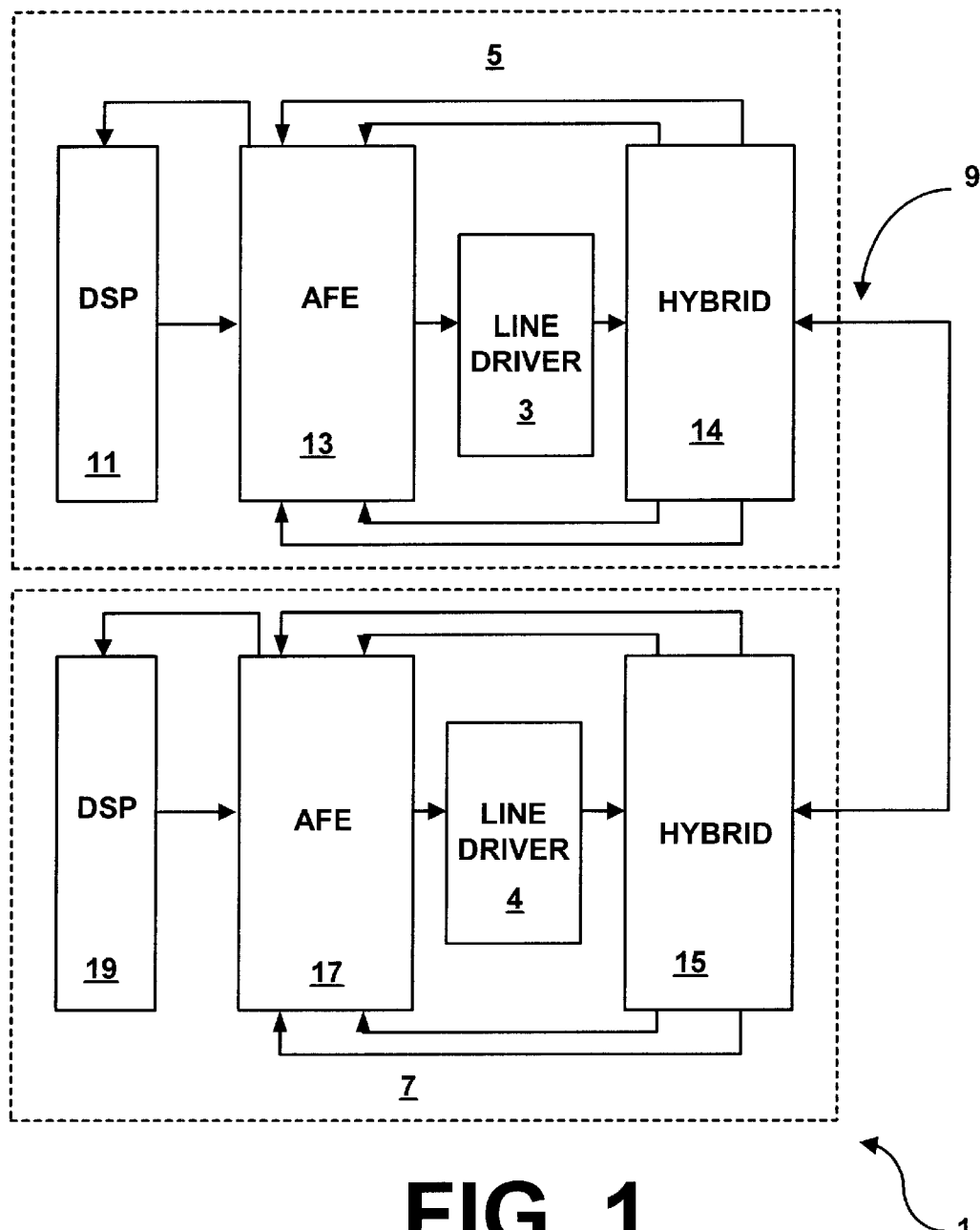
FIG. 1 is a prior art top-level representation of a typical digital subscriber line system utilizing an external line driver.

Turning now to the drawings, wherein like referenced numerals designate corresponding parts throughout the drawings, FIG. 1 shows a prior art top level representation of a typical DSL system 1 utilizing an external line driver 3. The DSL system 1 represented illustrates transmission of data from a central office (CO) 5 to a customer premises (CP) 7 via a transmission line 9, such as, but not limited to, a two-wire pair, and transmission of data from the CP 7 to the CO 5. With regard to the present illustration, transmission of data may be directed from the CP 7 to the CO 5, from the CO 5 to the CP 7, or in both directions at the same time. As is known, the CO 5 included a line card that includes a DSP 11, which receives information from a data source and sends information to an AFE 13. The AFE 13 interfaces between an analog line, such as, but not limited to, the two-wire pair 9, used for signal transmission, and the DSP 11 and functions to convert digital data, from the DSP 11, into a continuous time analog signal.

The analog signal is delivered, via a line driver 3, in accordance with the amount of power required to drive the amplified analog signal through the two-wire pair 9 and to the CP 7. A hybrid 15, located in the CP 7, is then used to de-couple the received signal from the transmitted signal, by subtracting the transmitted signal from the sum of the transmitted and received signal. The AFE 17, located in the CP 7, then converts the received analog signal into a digital signal, which is then transmitted to a DSP 19 located in the CP 7. Finally, the digital information is transmitted to the data source specified to receive the information.

If however, an analog signal is delivered from the CP 7 to the CO 5, line driver 4 will deliver the signal in accordance with the amount of power required to drive the amplified analog signal through the two-wire pair 9 and to the CO 5. A hybrid 14, located in the CO 5, is then used to de-couple the received signal from the transmitted signal, by subtracting the transmitted signal from the sum of the transmitted and received signal. The AFE 13, located in the CO 5, then converts the received analog signal into a digital signal, which is then transmitted to DSP 11 located in the CO 5. Finally, the digital information is transmitted to the data source specified to receive the information.

Figure 2:
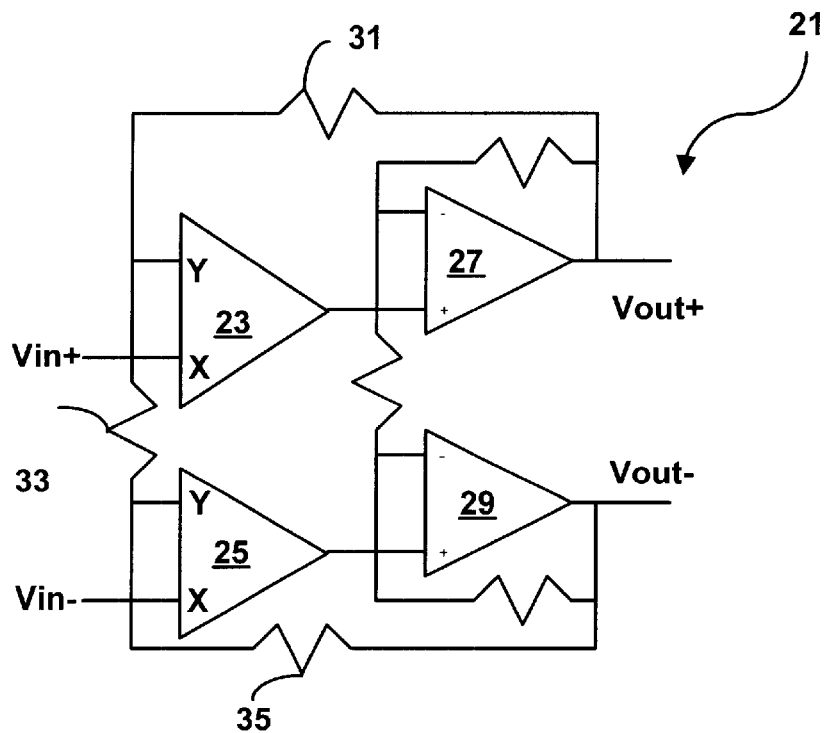
FIG. 2 is a prior art conventional line driver architecture, further illustrating the line driver of FIG. 1.

Referring now to FIG. 2, a prior art line driver 21 architecture is illustrated. Herein, a first voltage (Vin+) is introduced into a first port X of preamplifier 23, and a second voltage (Vin−) is introduced into a first port X of preamplifier 25 (Vin+ and Vin− comprising a differential signal). Amplifier 23 serves as a preamplifier, and drives the input voltage Vin+ to driver 27. Amplifier 25 also serves as a preamplifier, and drives the input voltage Vin− to driver 29. Drivers 27 and 29 receive the driven voltage from the preamplifiers 23, 25 and amplify the driven voltage so that the line driver 21 derives a predetermined gain. Resistors 31, 33, and 35 are responsible for the closed loop gain value of the conventional line driver 21 due to the gain being equivalent to $$\frac{R31 + R33 + R35}{R33},$$

wherein, R31 is the resistance of resistor 31, R33 is the resistance of resistor 33, and R35 is the resistance of resistor 35. Therefore, the gain of the conventional line driver architecture configuration is always a value greater than one. For illustrative purposes, resistors 31, 33 and 35 were selected to be equivalent, thereby obtaining an overall conventional line driver 21 gain of three.

Being that the input voltages, Vin+ and Vin−, of the conventional line driver 21 are applied directly to their respective preamplifier inputs, the input differential stage of each preamplifier recognizes the entire input swing. This is due to the input common mode tracking the input voltage applied to Vin+ on preamplifier 23 and Vin− on preamplifier 25.

As is known to one of reasonable skill in the art, in a non-inverting architecture, as utilized in this prior art conventional line driver architecture 21, the input common mode tracks the input voltage. The gain of each preamplifier 23, 25, is proportional to the transconductance of its input devices, and its transconductance is a function of its common mode input voltage. Thus, if the common mode varies, the gain will vary, and distortion will result. The closed loop gain of the line driver 21 is given by Vout=Vin $$(A/(A+1))\left(\frac{R31 + R33 + R35}{R33}\right),$$

where A is the open loop gain. Therefore, with respect to FIG. 2, $$Vout+ = Vin+ (A/(A+1))\left(\frac{R31 + R33 + R35}{R33}\right)$$

and $$Vout- = Vin- (A/(A+1))\left(\frac{R31 + R33 + R35}{R33}\right).$$

Thus, if A changes as Vin changes, it is obvious that Vout will no longer be a scaled version of Vin, and distortion will result. As long as A remains constant, the output voltage is simply a scaled version of the input signal Vin, otherwise, distortion results as it does in this conventional line driver architecture 21. Therefore, it is desirable to keep A constant, whether or not Vin changes.

Figure 3:
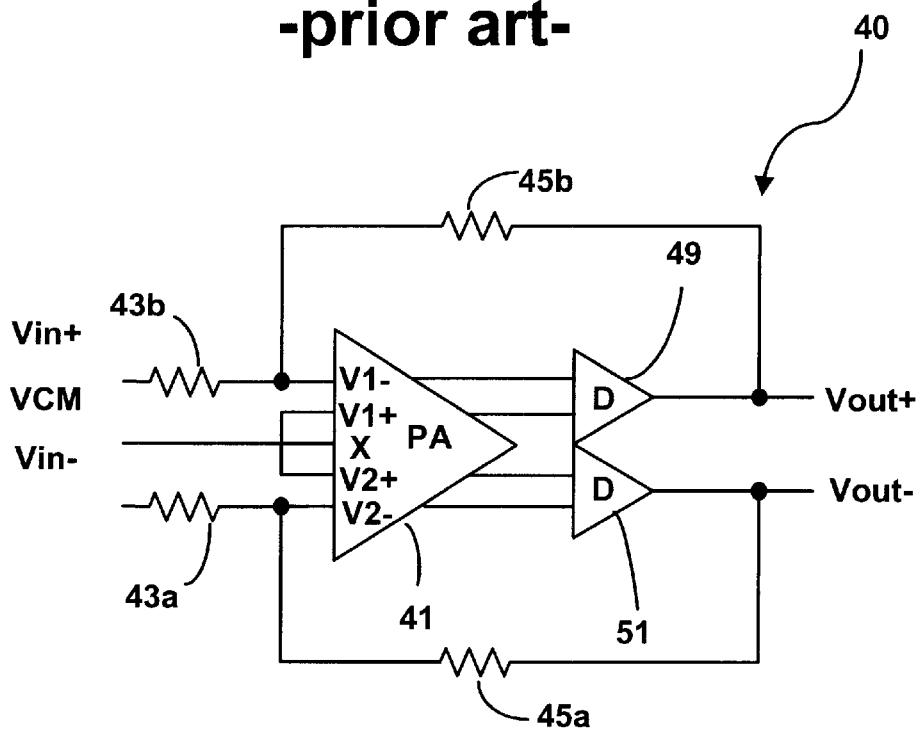
FIG. 3 depicts a line driver architecture in accordance with the preferred embodiment of the invention.

Referring now to FIG. 3, a line driver architecture 40, in accordance with the preferred embodiment of the invention, is illustrated. A preamplifier 41 is utilized, having a first terminal X attached to a common mode voltage (VCM), and at least two other input terminals, which sit at the VCM level since the preamplifier 41 has a virtual ground and negative feedback. In accordance with the preferred embodiment, four input terminals are used in addition to the first terminal X, namely V1−, V1+, V2+, and V2−. A current is driven through resistor 43a and resistor 45a so that Vout− is equivalent to $$\frac{-R45a * Vin-}{R43a} + VCM.$$

Similarly, a current is driven through resistor 43b and 45b so that $$\frac{-R45b * Vin+}{R43b} + VCM.$$

For a balanced structure resistor 43a is chosen to equal to resistor 43b and resistor 45a is chosen to be equal to resistor 45b, the differential output voltage then being given by the equation $$\frac{R45*[(Vin-)-(Vin+)]}{R43} = [(Vout+)-(Vout-)].$$

As resistors 45a and 45b decrease in value, approaching 0, Vout− and Vout+ approach the common mode voltage and the gain of the line driver 40 approaches 0 as the differential output approaches 0. Therefore, by regulating the values of resistors 45a and 45b, a desired gain may be achieved regardless of whether the gain value is below or above 1. Further, the input to preamplifier 41 sits at the common mode voltage, thereby inhibiting a common mode input voltage swing which, as previously mentioned, attributes to distortion in a line driver architecture.

Preamplifier 41 drives the inputted common mode voltage to drivers 49 and 51, which, as mentioned with reference to FIG. 2, supply power to drive the selected cable. Therefore, the voltage inputs of preamplifier 41 and each driver 49, 51 are set at the VCM voltage level. Since all input nodes of the preamplifier 41 and drivers 49, 51 sit at VCM, there is reduced distortion in the present line driver architecture 40 attributed to there being no common mode input swing. As previously mentioned with reference to FIG. 2, common mode swing refers to moving the common mode voltage of an amplifier. Since the present line driver architecture 40 maintains the inputs to the preamplifier and drivers at the VCM voltage level, there is no input swing, and hence, reduced signal distortion.

Figure 4:
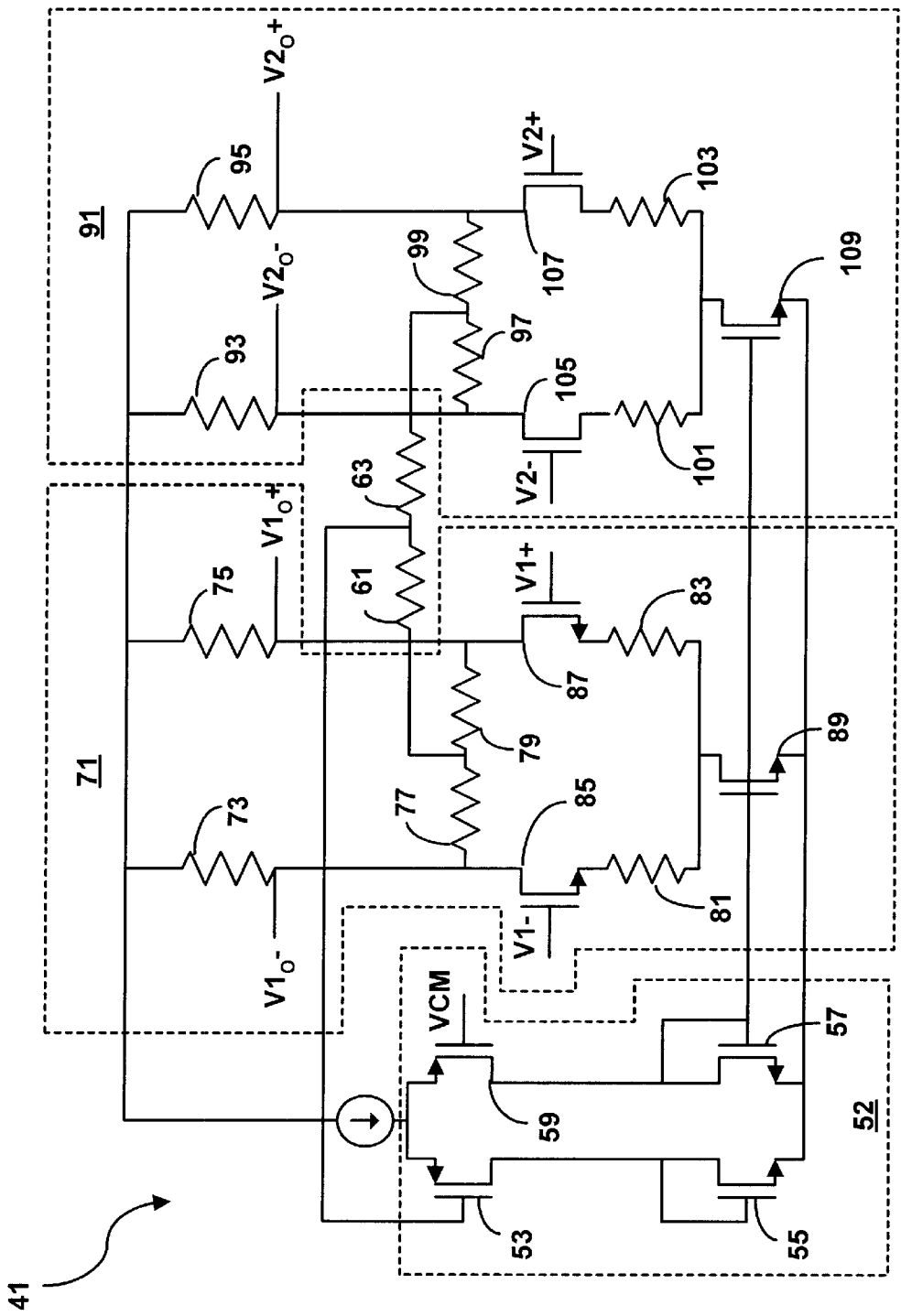
FIG. 4 further illustrates the preamplifier of FIG. 3.

Referring now to FIG. 4 the internal structure of the preamplifier 41 of FIG. 3 is illustrated. Herein, transistors 53, 55, 57 and 59 form a common mode amplifier 52, which amplifies specific voltages, within the preamplifier 41, to the common mode voltage level, as shall be described hereinafter. As an example, the common mode amplifier 52 amplifies the voltage between resistors 61 and 63 so that the voltage at this point is equal to the common mode voltage. A first preamplifier 71 is identified by resistors 73, 75, 77, 79, 81, and 83, transistors 85, 87 and 89, and input voltages V1− and V1+. A second preamplifier 91 is identified by resistors 93, 95, 97, 99, 101, and 103, transistors 105, 107 and 109, and input voltages V2− and V2+. With reference to the first preamplifier 71, output voltages V1o− and V1o+ are equivalent to the voltages across resistors 73 and 75 respectively. With reference to the second preamplifier 91, output voltages V2o− and V2o+ are equivalent to the voltages across resistors 93 and 95 respectively.

Resistors 77 and 79 of the first preamplifier 71 detect the average output voltage of the first preamplifier 71. With reference to the second preamplifier 91, resistors 97 and 99 detect the average output voltage of the second preamplifier. Resistors 61 and 63 take the average voltages of the first preamplifier 71 and the second preamplifier 91, and take the average of these two amplifiers. This average voltage is fed to the common mode amplifier 52, which in turn drives the average of the voltage outputs to be equivalent to the common mode voltage, via transistors 89 and 109. Finally, a bias current, I, is fed into the common mode amplifier 52, thereby biasing up the common mode amplifier 52. It should be noted that it is desirable for the tail current, which is fed into the common mode amplifier 52, to inversely track the resistance of load resistors 73, 75, 93, and 95, so that the common mode amplifier 52 is balanced when the appropriate tail current is supplied to the two preamplifier stages 71, 91.

Figure 5:
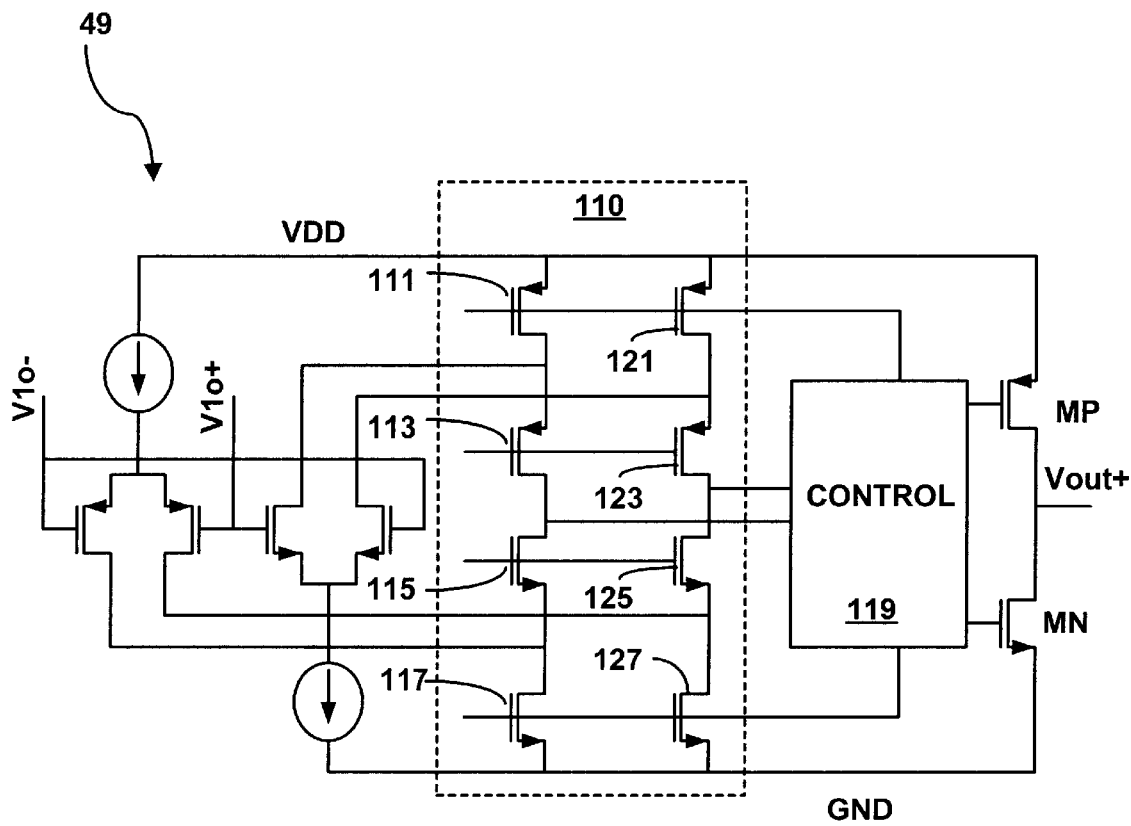
FIG. 5 further illustrates one of the drivers of FIG. 3.

As previously noted, distortion is inversely proportional to the open loop gain of the line driver 40. Herein, the open loop gain of the line driver 40 is equivalent to the gain of the preamplifier 41 multiplied by the gain of drivers 49 and 51, wherein preamplifier, 41, open loop gain calculation is referred to as an input stage, and driver 49, 51, calculation of open loop gain, as described with reference to FIG. 5, is referred to as an output stage.

In accordance with the preferred embodiment of the invention, the open loop gain of preamplifier 41 is programmable. It is also an inherent property of DSL drivers, in general, that the open loop gain of output drivers is inversely proportional to the load they are driving. Therefore, if a large load is being driven, the open loop gain of the line driver 40 drops, and distortion increases. In accordance with the preferred embodiment of the invention, compensation for reduction in open loop gain in the output stage is performed in the preamplifier 41.

Referring back to FIG. 4, assuming that input devices 85, 87, 105 and 107 have infinite transconductance, resistors 81, 83, 101, and 103 are variable, and the gain of the preamplifier 41 is simply given by the ratio of load resistors to emitter degeneration resistors, namely the ratio of resistor 73 to 81, 75 to 83, 93 to 101, and 95 to 103. Thus, programmable preamplifier open loop gain is incorporated, thereby utilizing as much gain as allowed for by the particular application considered. If, however, infinite transconductance is not assumed, the open loop gain of the preamplifier 41 is equal to $$\frac{R1}{(R2+(1/\text{gm}))}.$$

Herein, R1 and R2 may relate to the resistance of, either, resistors 73 and 81 respectively, resistors 75 and 83 respectively, resistors 93 and 101 respectively, or resistors 95 and 103 respectively. Likewise, gm may be the transconductance of any of transistors 85, 87, 105, or 107.

Further, across processing, the maximum stable gain will vary. Making the open loop gain programmable under digital control allows for the utilization of all available open loop gain for minimum distortion, for each processing corner, as well as for all operating conditions.

Referring to FIG. 5, one of the output devices of the output stage, namely, either driver 49 or driver 51 of FIG. 3, is further illustrated. For purposes of illustration, device 49 has been selected, however, it should be noted that driver 51 may instead be substituted. Herein, driver 49 contains a gain stage 110, a class-AB control stage 119, and the output devices MN and MP. It should be noted that while the gain stage used in the preferred embodiment is a folded cascode gain stage, comprising transistors 111, 113, 115, 117, 121, 123, 125 and 127, other gain stages may be used. In accordance with the preferred embodiment of the invention, the size of output devices, MN and MP, are programmable under digital control to be set according to each DSL application and line condition. As such, digital programmability of the output drive allows the line driver 40 to be reconfigured by digital control, so as to allow for the driving of the two-wire pair 9, regardless of whether an unexpected impedance, such as a bridge tap, is attached to the two-wire pair 9.

If the output devices, MN and MP, are too small for a given application significant distortion is obtained, due to clipping. However, if the output devices, MN and MP are too large, a reduced bandwidth and excessive power dissipation is received. Therefore, the DSP 11 of FIG. 1 first configures the line driver 40 to a default state for the given DSL application. If significant distortion is observed, as would be the case for a bridge tap, the line driver 40 is reconfigured in terms of open loop gain as well as drive capability until the signal is at a predetermined desirable level. Thus, the two-wire pair 9 receives extra power only when such power is required, thereby assuring an overall optimum distribution of power.

In an alternative embodiment, the line driver 40 can reconfigure the same driver 49 for a variety of different applications, while operating to function optimally for each application. Thus, the same basic driver 49 can be configured to drive most applications, including, but not limited to, 2B1Q HDSL and DMT ADSL CO, all with the minimum required quiescent current.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of the present invention and protected by the following claims.

The following is claimed:

1. A line driver, comprising:

an input stage defined by a preamplifier having at least one input, wherein said input receives an independently controlled and applied common mode voltage; and an output stage defined by at least two drivers which provide a required power for said line driver to drive a line, said drivers further having at least one input each, wherein said input of the driver receives said independently controlled and applied common mode voltage driven by said preamplifier, and the input common mode of the preamplifier and output drivers is independent from a line driver input signal.

2. The line driver of claim 1, wherein said line is a two-wire pair.

3. The line driver of claim 1, wherein said line driver has a gain capable of being changed to a value below or above 1.

4. The line driver of claim 1, wherein said output stage is further defined by the use of at least one programmable output device to allow for maximum drive capability of said drivers to be programmed under digital control.

5. The line driver of claim 1, wherein said line driver is located within an analog front end.

6. The line driver of claim 1, wherein said line driver is located in a customer premises.

7. The line driver of claim 1, wherein said line driver is located in a central office.

8. The line driver of claim 1, wherein said preamplifier is further defined by a first internal preamplifier having a first average output voltage, a second internal preamplifier having a second average output voltage, and a common mode amplifier which drives said first average output voltage and said second average output voltage to be equivalent to said common mode voltage.

9. The line driver of claim 1, wherein an open loop gain of said preamplifier is programmable under digital control.

10. The line driver of claim 1, wherein said preamplifier of said input stage is capable of compensating for a reduction in an open-loop gain of said output stage.

11. A method of driving a line, comprising the steps of:

deriving an open loop gain of a preamplifier located in an input stage of a line driver; and deriving an open loop gain of at least two drivers located in an output stage of said line driver, wherein said drivers provide power required for said line driver to drive said line, wherein said preamplifier and said drivers have at least one input each, said inputs sitting at an independently controlled and applied common mode voltage that is independent from a line driver input signal.

12. The means of claim 11, wherein said preamplifier has a gain capable of being changed to a value below or above 1.

13. The means of claim 11, wherein said output stage is further defined by the use of at least one programmable output device, to allow for maximum drive capability of said drivers to be programmed under digital control.

14. The means of claim 11, further comprising the step of compensating for reduction in said open loop gain, in said output stage, by said preamplifier of said input stage.

15. A transceiver, comprising:

at least one digital signal processor;

at least one analog front end, attached to said digital signal processor;

at least one line driver located within said analog front end, said line driver defined by an input stage and an output stage, wherein said input stage is defined by a first preamplifier having at least one input, said input sitting at an independently controlled and applied common mode voltage, and said output stage is defined by at least two drivers having at least one input each, said input of the driver sitting at an independently controlled and applied common mode voltage, said at least two drivers providing required power for said line driver to drive said line, wherein the input common mode of the preamplifier and output drivers is independent from a line driver input signal;

at least one hybrid, attached to said analog front end; and at least one line for the transmission and reception of information.

16. The transceiver of claim 15, wherein said line is a two-wire pair.

17. The transceiver of claim 15, wherein said first preamplifier has a gain capable of being changed to a value below or above 1.

18. The transceiver of claim 15, wherein said at least two drivers are further defined by the use of at least one programmable output device, to allow for maximum drive capability of said drivers to be programmed under digital control.

19. The transceiver of claim 18, wherein said programmable output device comprises a gain stage and a control stage.

\* \* \* \* \*